United States Patent
Dzafic

(10) Patent No.: US 11,016,134 B2
(45) Date of Patent: May 25, 2021

(54) DETERMINATION OF POWER TRANSMISSION LINE PARAMETERS USING ASYNCHRONOUS MEASUREMENTS

(71) Applicant: SIEMENS AKTIENGESELLSCHAFT, Munich (DE)

(72) Inventor: Izudin Dzafic, Sarajevo (BA)

(73) Assignee: Siemens Aktiengesellschaft, Munich (DE)

( * ) Notice: Subject to any disclaimer, the term of this patent is extended or adjusted under 35 U.S.C. 154(b) by 132 days.

(21) Appl. No.: 16/402,465

(22) Filed: May 3, 2019

(65) Prior Publication Data

US 2019/0339320 A1 Nov. 7, 2019

(30) Foreign Application Priority Data

May 3, 2018 (EP) .................................... 18170499

(51) Int. Cl.
*G01R 31/08* (2020.01)

(52) U.S. Cl.
CPC ......... *G01R 31/085* (2013.01); *G01R 31/088* (2013.01)

(58) Field of Classification Search
CPC .... G01R 31/085; G01R 31/088; G01R 27/02; Y02E 40/70; Y04S 10/22; H02H 3/006
(Continued)

(56) References Cited

U.S. PATENT DOCUMENTS

| | | | | |
|---|---|---|---|---|
| 10,656,197 B2* | 5/2020 | Dase | .................. | G01R 19/2513 |
| 2002/0121903 A1* | 9/2002 | Hu | ....................... | G01R 31/085 |
| | | | | 324/522 |
| 2006/0097728 A1* | 5/2006 | Saha | ...................... | H02H 3/385 |
| | | | | 324/525 |
| 2009/0200872 A1* | 8/2009 | Johansson | ............. | H02J 3/1807 |
| | | | | 307/102 |

(Continued)

OTHER PUBLICATIONS

Indulkar, C S et al: "Estimation of transmission line parameters from measurements", International Journal of Electrical Power & Energy Systems, Jordan Hill, Oxford, GB, vol. 30, No. 5, Jun. 1, 2008, (Jun. 1, 2008) pp. 337-342, XP022637220, ISSN: 0142-0615, DOI:10.1016/J.IJEPES.2007.08.003 [retrieved on Jan. 25, 2008].

(Continued)

*Primary Examiner* — Giovanni Astacio-Oquendo
(74) *Attorney, Agent, or Firm* — Laurence Greenberg; Werner Stemer; Ralph Locher

(57) ABSTRACT

There is described a method of determining power transmission line parameters using non-synchronous measurements acquired from different locations along a power transmission line. The method comprises (a) acquiring first measurement data comprising corresponding pairs of voltage and current measurement values measured at a first location along the power transmission line at predetermined points in time relative to a first time reference, (b) acquiring second measurement data comprising corresponding pairs of voltage and current measurement values measured at a second location along the power transmission line at predetermined points in time relative to a second time reference, (c) calculating initial values of the power transmission line parameters and an initial value of the difference between the first time reference and the second time reference based on the first measurement data and the second measurement data, and (d) calculating resulting values of the power transmission line parameters and a resulting value of the difference between the first time reference and the second time reference by utilizing a least squares algorithm and the initial values of the power transmission line parameters, the initial value of the difference between the first time reference and the second time reference, the first measurement data, and the second measurement data. Furthermore, a data acquisition device and a system for determining power transmission line parameters as well as a computer program and a data carrier are described.

13 Claims, 1 Drawing Sheet

(58) Field of Classification Search
USPC .......................................... 324/522, 512, 500
See application file for complete search history.

(56) References Cited

U.S. PATENT DOCUMENTS

| | | | | |
|---|---|---|---|---|
| 2012/0193915 A1* | 8/2012 | Liu | ........................ | H02J 3/1885 |
| | | | | 290/44 |
| 2017/0194792 A1* | 7/2017 | Zimmanck | ................ | H02J 3/32 |
| 2020/0348352 A1* | 11/2020 | Gajare | ................. | G01R 31/085 |
| 2021/0003625 A1* | 1/2021 | Naidu | .................. | G01R 31/085 |

OTHER PUBLICATIONS

Di, Shi et al: "Identification of short transmission-line parameters from synchrophasor measurements", Power Symposium, 2008 NAPS '08, 40th North American, IEEE, Piscataway, NJ, USA, Sep. 28, 2008 (Sep. 28, 2008) pp. 1-8, XP031558574, ISBN: 978-1-4244-4283-6.

Lahmar, Mustafa et al: "Accurate methods for estimating transmission line parameters using synchronized and unsynchronized data", 2017 Nternational Energy and Sustainability Conference (IESC), IEEE, Oct. 19, 2017 (Oct. 19, 2017), pp. 1-5, XP033276947, DOI: 10.1109/IESC.2017.8167474, [retrieved on Dec. 5, 2017].

Izykowski, J. et al: "Accurate Location of Faults on Power Transmission Lines With Use of Two-End Unsynchronized Measurements", IEEE Transactions on Power Deliv, IEEE Service Center, New York, NY, US, vol. 21, No. 2, Apr. 1, 2006 (Apr. 1, 2006), pp. 627-633, XP007904680, ISSN: 0885-8977, DOI:10.1109/TPWRD.2005.858778.

Dawidowski, Pawel et al: "Analytical Synchronization of Two-End Measurements for Transmission Line Parameters Estimation and Fault Location", IU-JEEE, vol. 13, No. 1, Apr. 3, 2013 (Apr. 3, 2013) pp. 1569-1574, XP055506704.

* cited by examiner

DETERMINATION OF POWER TRANSMISSION LINE PARAMETERS USING ASYNCHRONOUS MEASUREMENTS

CROSS-REFERENCE TO RELATED APPLICATION

This application claims the priority, under 35 U.S.C. § 119, of European patent application EP 18170499, filed May 3, 2018. The prior application is herewith incorporated by reference.

FIELD OF INVENTION

The present invention relates to the field of electric power transmission systems, in particular to a method of determining power transmission line parameters using non-synchronous measurements acquired from different locations along a power transmission line. Furthermore, the present invention relates to a data acquisition device and a system for determining power transmission line parameters. The present invention also relates to a computer program for carrying out the method, and to a data carrier loaded with such a program.

ART BACKGROUND

Accurate knowledge of transmission line parameters are of huge importance in power system analysis and power system applications in industry. Values of the transmission line parameters of a power system are usually calculated by electrical utilities using ideal models and data provided by manufacturers. Previously, values of the transmission line parameters was computed using tower geometry, conductor dimensions, actual line length estimates, and conductor sag, which were only approximating the true value of these parameters. However, in reality, transmission line parameters are affected by weather changes, human errors and/or various modeling inaccuracies. In some cases, it is impossible to estimate the exact value of these parameters, which can lead to considerable mismatches and errors in monitoring and control of the power system operation. If line parameters do not match the actual parameters, it affects the fault location methods. Even if the geometry of line conductors is accurately taken for calculating the line impedance, the total line length could be known with some error. Due to this, accurate estimation of line parameters has been the objective of many research projects. Incorrect computation of the parameter values affects applications that involve them. Some of the most important applications are found in power system protection relays, transmission planning models, state estimation and fault location analysis. These important applications are briefly described in the following.

Power System Protection Relays: The accuracy of the line parameters is especially important in areas of power system protection, where many distance relaying algorithms use line parameters to determine proper relay settings, calculate fault distance, and make a sound tripping decision. There are two main types of power system protection relays, i.e. overcurrent and impedance relays. Overcurrent relays are monitoring current across a transmission line and activating a circuit breaker when the monitored current exceeds a preset value. Input settings for this type of relay are calculated by examining the maximum load and minimum fault currents related to a line segment. In order to obtain these values, it is necessary to have accurate values of the transmission line's phase and sequence impedance. Incorrect values would introduce error in the input settings that control the circuit breaker and cause improper operation. An impedance relay considers the ratio obtained by taking voltage and current measurements from the instrument transformers. If the impedance is below a certain threshold, the relay is sending a signal that isolates the faulted line from the system. This type of relay is more sensitive to inaccurate parameter values.

Transmission Planning Models: Aim of the transmission planning models is to assure reliable and proper supply to all forecasted loads under normal and contingency conditions. If all the transmission system elements are in service, then the system is considered to operate under normal conditions. Emergency conditions arise when one or more elements are not operating properly or are out of service. Transmission system planners are performing certain analyses using power system simulation software, where contingency conditions are simulated and the system is tested. If the system fails to fulfill the requirements during any point of the contingency study, the planner is responsible for installing new transmission infrastructure that will correct the problem. Inaccurate estimation of the transmission line parameters would violate the contingency analysis. This would cause unnecessary money and energy investment into a power system.

State Estimation: State estimation enables real-time monitoring and observation of power system condition. Utilizing measurements of real and reactive power flow across the network, the system topology, transformer, generator and line parameter values that constitute the system, the estimator calculates the desired state variables. Generally, the state variables are voltage magnitude and phase at every node in the system. Imprecise transmission line parameter values would cause bad estimation of the network conditions.

Fault Location Analysis: Accurate transmission line parameters represent crucial elements in the impedance based fault location analysis. Existing algorithms that use line impedance in fault analysis can be one-end, two-end and multi-end algorithms. Most of the research is focused on the one-end impedance-based fault location algorithms, due to its simplicity and economical efficiency. One-end impedance-based fault location algorithms estimate a distance to fault using voltages and currents collected at a particular end of the line. These algorithms estimate the fault-location by using local data, and do not require communication with the remote end. However, the accuracy of this type of algorithm is normally affected by the fault resistance, even though certain compensation techniques are developed to reduce this effect. In contrary to this type of algorithm, two-end algorithms process signals from both terminals of the line, and thus, a larger amount of information is employed. Therefore, performance of the two-end algorithms is generally superior in comparison to the one-end approaches.

The development of Phasor Measurement Units (PMUs) has brought a possibility of more precise and accurate calculation of transmission line parameters. A PMU provides current and voltage values in digital form. PMU measurements have greater accuracy than other measurements, its data are time tagged with an accuracy better than 1 µs and have a magnitude accuracy higher than 0.1%.

In reality, all measurements carry a certain error, even though PMUs are labeled with high accuracy. However, in the actual field installation, the accuracy is often decreased due to some instrumentation errors or system imbalances. Digital measurements at different line terminals can be obtained synchronously if the global positioning system (GPS) or a similar system is available. However, this is not always the case and the hardware needed for providing a common time reference is expensive.

Accordingly, a need exists for a precise, reliable and cheap way of determining power transmission line parameters based on asynchronous measurement data.

SUMMARY OF THE INVENTION

This need may be met by the subject matter set forth in the independent claims. Advantageous embodiments of the present invention are set forth in the dependent claims.

According to a first aspect of the invention, there is provided a method of determining power transmission line parameters using non-synchronous measurements acquired from different locations along a power transmission line. The method comprises (a) acquiring first measurement data comprising corresponding pairs of voltage and current measurement values measured at a first location along the power transmission line at predetermined points in time relative to a first time reference, (b) acquiring second measurement data comprising corresponding pairs of voltage and current measurement values measured at a second location along the power transmission line at predetermined points in time relative to a second time reference, (c) calculating initial values of the power transmission line parameters and an initial value of the difference between the first time reference and the second time reference based on the first measurement data and the second measurement data, and (d) calculating resulting values of the power transmission line parameters and a resulting value of the difference between the first time reference and the second time reference by utilizing a least squares algorithm and the initial values of the power transmission line parameters, the initial value of the difference between the first time reference and the second time reference, the first measurement data, and the second measurement data.

This aspect of the invention is based on the idea that first and second measurement data are acquired asynchronously (relative to respective first and second time references) at respective first and second locations along the power transmission line. First, initial values of the sought power transmission line parameters and the difference between the first and second time reference are calculated on the basis of the first and second measurement data. These initial values may in particular be rather rough estimates and are used together with the first and second measurement data as a basis for calculating resulting values, i.e. very precise estimates of the respective values, by means of a least squares algorithm. In short, the asynchronous measurement data are processed to obtain precise estimates of the power transmission line parameters. Furthermore, a precise estimate of the time difference between the first and second measurement data (or the amount of asynchronicity) is obtained. Thus, the present invention is capable of providing precise estimates of power line parameters without the need for expensive measurement hardware capable of acquiring synchronous measurement data. The method can, however, just as well be used with synchronous measurements (be it by coincidence or not). In this case, the resulting value of the time difference will be equal (or at least very close) to zero.

In the present context, the term "voltage and current measurement values" may in particular denote complex values of voltage and current, in particular complex phasors.

According to an embodiment of the invention, the power transmission line parameters comprise series conductance, series susceptance, and shunt capacitance.

If desirable, more parameters, in particular shunt resistance, may be added to the above non-exhaustive list.

According to a further embodiment of the invention, the initial value of the series conductance and the initial value of the series susceptance are calculated by (a) calculating a first admittance based on the first measurement data, (b) calculating a second admittance based on the second measurement data, (c) calculating a series impedance based on the first admittance and the second admittance, (d) calculating the initial value of the series conductance as the real part of the reciprocal of the series impedance, and (e) calculating the initial value of the series susceptance as the imaginary part of the reciprocal of the series impedance.

According to this embodiment, first and second admittances are respectively calculated based on the respective voltage and current measurement values, e.g. as $Y'_1=I_1/U_1$ and $Y'_2=-I_2/U_2$, where $I_1$ is the complex current and $U_1$ is the complex voltage of the first measurement data, and where $I_2$ is the complex current and $U_2$ is the complex voltage of the second measurement data. By convention, both currents are considered to flow into the power transmission line from the respective ends, hence the minus in the above formula for $Y'_2$. Ignoring (at this stage) the shunt capacity (and shunt resistance), an initial value of the series impedance $Z_S$ can be derived from the relation $1/Y'_1=Z_S+1/Y'_2$. The initial value of the series conductance is then calculated as the real part of $1/Z_S$ and the series susceptance is calculated as the imaginary part of $1/Z_S$.

According to a further embodiment of the invention, the initial value of the shunt capacitance is calculated by applying sensitivity analysis with regard to active power loss and reactive power loss.

More specifically, the initial value of the shunt capacitance is determined by iteratively identifying a capacitance value for which the difference between a calculated active power loss between the first and second location and a measured active power loss between the first and second location (i.e. an active power loss obtained from the first and second measurement data) is within a predetermined tolerance and/or for which the difference between a calculated reactive power loss between the first and second location and a measured reactive power loss between the first and second location (i.e. a reactive power loss obtained from the first and second measurement data) is within the predetermined tolerance.

In other words, the initial capacitance value is determined iteratively by reducing the difference between measured and calculated active and/or reactive power losses between the first and second locations to be within the predetermined tolerance.

According to a further embodiment of the invention, the initial value of the difference between the first time reference and the second time reference is calculated as a difference between the phase of the voltage of the second measurement data and the phase of a voltage calculated on the basis of the first measurement data and the initial value of the series conductance, the initial value of the series susceptance, and the initial value of the shunt capacitance.

In other words, a complex value of the voltage at the second location is calculated based on the first measurement data (i.e. voltage and current at the first location) and the initial values of the series conductance, series susceptance, and shunt capacitance. Accordingly, the phase of this calculated voltage is the phase of the voltage at the second location relative to the first time reference. Thus, by subtracting the phase of the calculated voltage from the phase of the voltage of the second measurement data (i.e. the phase of the voltage at the second location measured relative to the second time difference), a corresponding initial value of the difference between the first and second time references is obtained.

According to a further embodiment of the invention, the first measurement data is acquired by a first data acquisition device positioned at the first location, the second measurement data is acquired by a second data acquisition device positioned at the second location, and the steps of calculating initial values and resulting values is carried out by the first data acquisition device after receiving the second measurement data from the second data acquisition device.

In other words, the first data acquisition device is acting as a master device in the sense that it collects the first measurement data itself, receives the second measurement data from the second data acquisition device (via a suitable data communication connection), and performs the calculations leading to the resulting values of the power transmission line parameters and the difference between the first and second time references.

According to a further embodiment of the invention, the method further comprises (a) sending a start signal from the first data acquisition device to the second data acquisition device, (b) sending a response signal from the second data acquisition device to the first data acquisition device, (c) determining a communication roundtrip time, and (d) continuing with the calculation of initial values and resulting values if the communication roundtrip time is below a predetermined threshold value.

According to this embodiment, the first data acquisition device sends a start signal to the second data acquisition device, which responds by sending a response signal to the first data acquisition device. The first data acquisition device now calculates the communication round trip time as the difference between the point of time where it sent the start signal and the point of time where it received the response signal. The predetermined threshold value may in particular be equal to the reciprocal value of the power transmission frequency, i.e. the duration of a single period. By only continuing with the calculations when the roundtrip time is below the duration of a period, calculation of erroneous parameter values is prevented.

According to a second aspect of the invention, a data acquisition device for determining power transmission line parameters is provided. The described data acquisition device comprises (a) a clock unit adapted to provide a time reference, (b) a data acquisition unit adapted to acquire measurement data comprising corresponding pairs of voltage and current measurement values at a location along a power transmission line at predetermined points in time relative to the time reference, (c) a data communication unit adapted to receive remote measurement data from a remote data acquisition device, the remote measurement data comprising corresponding pairs of voltage and current measurement values measured at a remote location along the power transmission line at predetermined points in time relative to a remote time reference, and (d) a data processing unit adapted to (d1) calculate initial values of the power transmission line parameters and an initial value of a difference between the time reference and the remote time reference based on the measurement data and the remote measurement data, and (d2) calculate resulting values of the power transmission line parameters and a resulting value of the difference between the time reference and the remote time reference by utilizing a least squares algorithm and the initial values of the power transmission line parameters, the initial value of the difference between the time reference and the remote time reference, the measurement data, and the remote measurement data.

The data acquisition device according to this aspect of the invention is based on the same idea as the first aspect discussed above. In particular, the data acquisition device according to the second aspect is capable of performing the method according to the first aspect.

According to a third aspect of the invention, there is provided a system for determining power transmission line parameters using non-synchronous measurements acquired from different locations along a power transmission line. The described system comprises (a) a first data acquisition device adapted to acquire first measurement data comprising corresponding pairs of voltage and current measurement values measured at a first location along the power transmission line at predetermined points in time relative to a first time reference, (b) a second data acquisition device adapted to acquire second measurement data comprising corresponding pairs of voltage and current measurement values measured at a second location along the power transmission line at predetermined points in time relative to a second time reference, and (c) a data processing device adapted to (c1) calculate initial values of the power transmission line parameters and an initial value of the difference between the first time reference and the second time reference based on the first measurement data and the second measurement data, and (c2) calculate resulting values of the power transmission line parameters and a resulting value of the difference between the first time reference and the second time reference by utilizing a least squares algorithm and the initial values of the power transmission line parameters, the initial value of the difference between the first time reference and the second time reference, the first measurement data, and the second measurement data.

The system according to this aspect of the invention is essentially based on the same idea as the first and second aspects discussed above. More specifically, the system comprises a first and a second data acquisition device and a data processing device adapted to perform the calculations of the method according to the first aspect. It should be noted that the data processing device may be a stand-alone device or part of the first or second data acquisition device.

According to an embodiment, the first data acquisition device is a phasor measurement unit (PMU), the first time reference is GPS time, and the first data acquisition device is adapted to use the resulting value of the difference between the first time reference and the second time reference to synchronize the second data acquisition device to the first time reference.

In this way, the second data acquisition device can be synchronized without the need for additional expensive hardware.

According to a fourth aspect of the invention, there is provided a computer program. The described computer program comprises computer executable instructions, which, when executed by a processor of a computer, are adapted to carry out the method according to the first aspect or any of the embodiments thereof.

The computer program according to this aspect is essentially based on the same idea as the first aspect and is in particular adapted to perform the corresponding method.

According to a fifth aspect of the invention, there is provided a data carrier loaded with the computer program according to the fourth aspect.

It is noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular to combinations of features of the method type claims and features of the apparatus type claims, is part of the disclosure of this document.

The aspects defined above and further aspects of the present invention are apparent from the examples of embodiments to be described hereinafter and are explained with reference to the examples of embodiments. The invention will be described in more detail hereinafter with reference to examples of embodiments. However, it is explicitly noted that the invention is not limited to the described exemplary embodiments.

DETAILED DESCRIPTION

Figure 1:
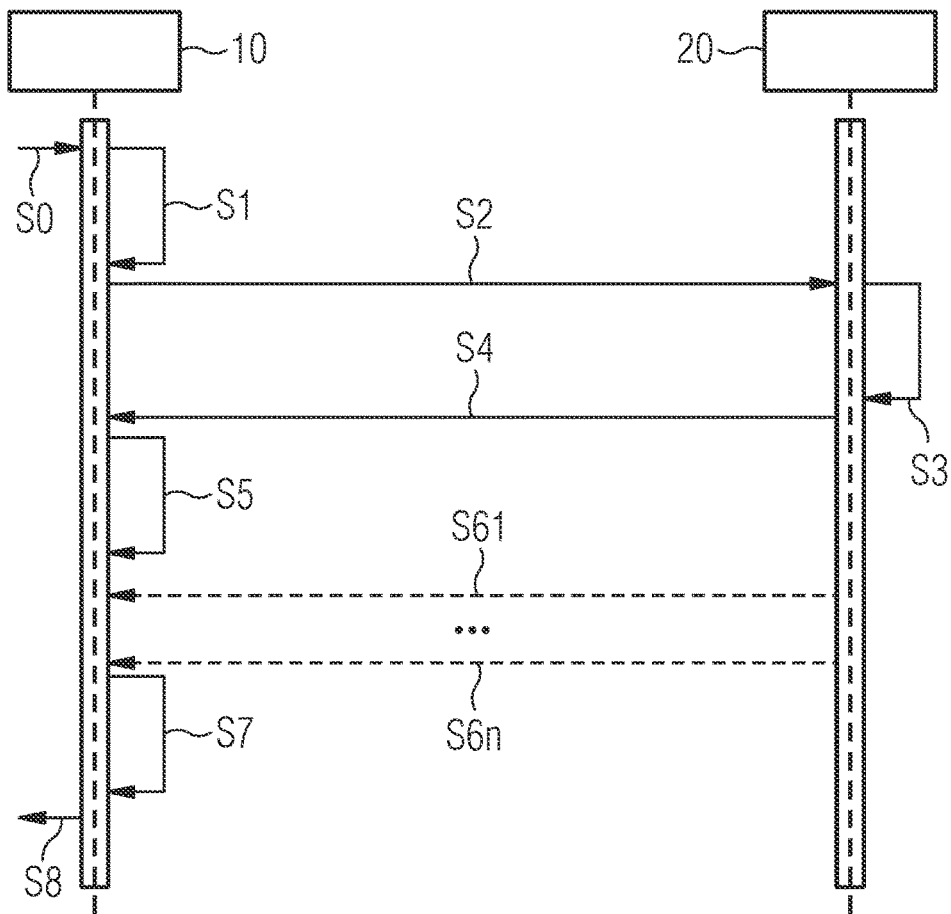
FIG. 1 shows a flow diagram of a method according to an embodiment of the present invention.

The illustration in the drawing is schematic. It is noted that in different figures, similar or identical elements are provided with the same reference numerals or with reference numerals which differ only within the first digit.

FIG. 1 shows a flow diagram of a method according to an embodiment of the present invention. More specifically, FIG. 1 shows the flow of messages and data between a first data acquisition device 10 and a second data acquisition device 20. The first data acquisition device 10 is arranged at a first location along a power transmission line (e.g. at one end of the transmission line) and acts as a master in this embodiment. The second data acquisition device 20 is arranged at a second location along the power transmission line (e.g. at the other end of the transmission line) and acts as a slave in this embodiment. The first data acquisition device 10 is adapted to perform a sequence of measurements to acquire first measurement data comprising vectors of voltage and current measurement values (samples). These measurements are carried out at predetermined points in time relative to a first time reference, such as an internal clock in the first data acquisition device 10. The internal clock may or may not be synchronized with GPS time. Similarly, the second data acquisition device 20 is adapted to perform a sequence of measurements to acquire vectors of voltage and current measurement values (samples). These measurements are carried out at predetermined points in time relative to a second time reference, such as an internal clock in the second data acquisition device 20. A data communication link (not shown) is present and allows the first data acquisition device 10 and the second data acquisition device 20 to communicate with each other. The data communication link may be any kind of wired or wireless link.

The method begins at S0 where the first (master) data acquisition device 10 receives a request for obtaining power transmission line parameter values, in particular values of series conductance, series susceptance, and shunt capacitance. Upon receiving the request, the first data acquisition device 10 begins, at S1, to acquire the first measurement data and, at S2, sends a start signal to the second (slave) data acquisition device 20. Upon receiving the start signal, the second data acquisition device 20 begins, at S3 to acquire the second measurement data and sends, at S4, a response signal to the first data acquisition device 10. Upon receiving the response signal from the second data acquisition device 20, the first data acquisition device 10 calculates a communication round trip time at S5 and checks that the communication round trip time is below a predetermined threshold, in particular below 1/f, where f is the power network frequency. In case of a 50 Hz power network frequency, the predetermined threshold equals 20 ms. If the check confirms that the communication round trip time is below the threshold, the method continues with S61 to S6$n$, where a total of n sets of measurement data is transmitted from the second data acquisition device 20 to the first data acquisition device 10. Upon receiving the measurement data from the second data acquisition device 20, the first data acquisition device 10 processes the first and second measurement data at S7 to obtain the desired power transmission line parameter values. The resulting parameter values are output at S8.

Figure 2:
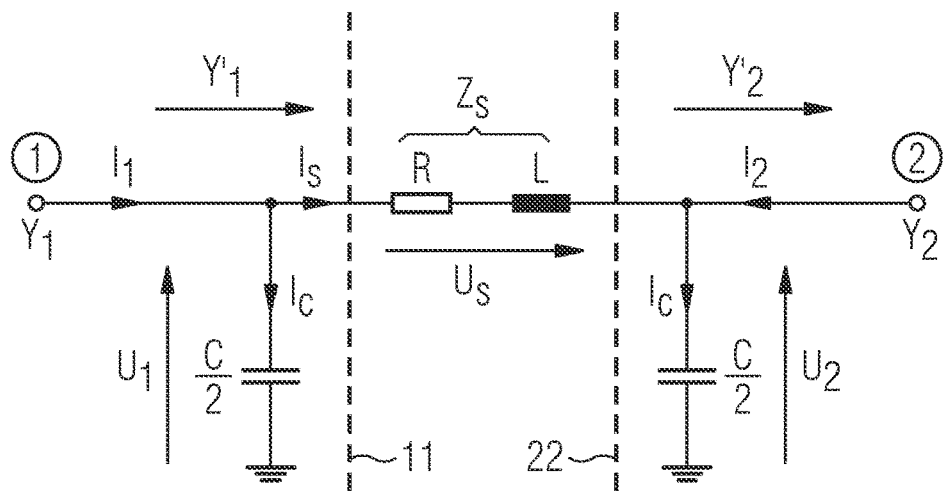
FIG. 2 shows a circuit diagram of a power transmission line model as used in accordance with an embodiment of the present invention.

Now, the processing at S7 referred to above will be described in more detail with reference to the circuit diagram of a power transmission line model shown in FIG. 2. Here, the first data acquisition device 10 is located at the far left node 1 and the second data acquisition device 20 is located at the far right node 2. Accordingly, the first data acquisition device 10 measures the voltage $U_1$ and the current $I_1$, while the second data acquisition device 20 measures the voltage $U_2$ and the current $I_2$. The power transmission line is modeled as a series impedance $Z_S$ consisting of a resistance R and an inductance L, i.e. $Z_S = R + j\omega L$, and a shunt capacitance C distributed in equal parts, i.e. C/2, at both ends of the transmission line.

First, initial values are calculated for the sought transmission line parameters G (series conductance), B (series susceptance), and C (shunt capacitance), and for the difference θ between the first and second time references.

More specifically, the initial values of G and B are calculated by ignoring the shunt capacitances C/2 (as indicated by dashed lines 11 and 22 in FIG. 2) and calculating a first admittance $Y'_1$ as the ratio between the measured current phasor $I_1$ and the measured voltage phasor $U_1$ at node 1, i.e. $Y'_1 = I_1/U_1$. Similarly, a second admittance $Y'_2$ is calculated as $Y'_2 = -I_2/U_2$. It follows from FIG. 2 that $1/Y'_1 = Z_S + 1/Y'_2$, such that $Z_S = 1/Y'_1 - 1/Y'_2$. The initial values of G and B are then calculated as $G = \text{real}(1/Z_S)$ and $B = \text{imag}(1/Z_S)$.

The initial value of C is calculated iteratively by applying sensitivity analysis. Prior to the iterative procedure, the following variables are set: $i=1$, $C=\Delta C=10^{-7}$, $B_C=\omega C$, $\Delta P_L^{(0)} = R \cdot |I_S|^2$, $\Delta Q_L^{(0)} = X \cdot |I_S|^2 - (B_C/2) \cdot (|U_1|^2 + |U_2|^2)$. Here, i denotes the iteration counter, $\Delta C$ is a step size, $B_C$ is the shunt susceptance, $\Delta P_L^{(0)}$ is the active power loss across the transmission line, $\Delta Q_L^{(0)}$ is the reactive power loss across the transmission line, and X is the reactance, i.e. $X = \omega L$. Furthermore, $I_S$ is the current through the series impedance $Z_S$ (see FIG. 2) and is given as $I_S = I_1 - U_1 \cdot B_C/2$.

Now the iterative procedure is performed as follows:

do

Find $Z_s^{(i)} = \dfrac{1}{Y_1' - j\dfrac{B_c^{(1)}}{2}} - \dfrac{1}{Y_2' - j\dfrac{B_c^{(1)}}{2}}$ Obtain $\Delta P_L^{(i)} = R \cdot |I_s|^2$ and $\Delta Q_L^{(i)} = X|I_s|^2 - \dfrac{B_c^{(1)}}{2}(|U_1|^2 + |U_2|^2)$ Determine coefficients $k_p = \dfrac{\Delta P_L^{(i)} - \Delta P_L^{(i-1)}}{\Delta C}$ and $k_q = \dfrac{\Delta Q_L^{(i)} - \Delta Q_L^{(i-1)}}{\Delta C}$ Resolve capacitance coefficient $k = \min(k_p, k_q)$ Compute $C = k \cdot \Delta C$; $B_c = \varpi C$ $i = i + 1$ while $|\Delta P_L^{(i)} - \Delta P_L^{(i-1)}| > \xi$ or $|\Delta Q_L^{(i)} - \Delta Q_L^{(i-1)}| > \xi$ The tolerance $\xi$ is a predetermined value, such as $\xi = 10^{-6}$.

Thus, the iterative process continues as long as the difference between successive values of the active power loss or the difference between successive values of the reactive power loss is larger than the tolerance $\xi$. In other words, the iterative process continues until both difference are less than or equal to the tolerance $\xi$.

The last initial value, i.e. the time difference θ is calculated by using the measured values at node 1 and a calculated value of the voltage drop $U_S$ across the series impedance $Z_S$ to calculate an expected phasor $U'_2$ for the voltage at node 2 and finding the phase difference between this expected voltage $U'_2$ and the measured voltage $U_2$, i.e. $θ = \arg(U_2) - \arg(U'_2)$, where $U'_2 = U_1 + U_S = U_1 + I_S \cdot Z_S$.

Having obtained the above initial values of G, B, C and θ, a least squares algorithm is now performed to find more exact (or resulting) values of these parameters. More specifically, the variable sought is the vector $x = [G\ B\ C\ θ]^T$ and the objective function f(x) is the complex currents $I_1$ and $I_2$ at the two nodes 1 and 2, which are given by the following equations:

$I_1^{re} = G \cdot U_1^{re} - (C-B)U_1^{im} - (G \cos θ - B \sin θ)U_2^{re} - (G \sin θ + B \cos θ)U_2^{im}$ $I_1^{im} = G \cdot U_1^{im} + (C-B)U_1^{re} - (G \cos θ - B \sin θ)U_2^{im} + (G \sin θ + B \cos θ)U_2^{re}$ $I_2^{re} = G \cdot U_2^{re} - (C-B)U_2^{im} - (G \cos θ - B \sin θ)U_1^{re} + (G \sin θ + B \cos θ)U_1^{im}$ $I_2^{im} = G \cdot U_2^{im} - (C-B)U_2^{re} - (G \cos θ - B \sin θ)U_1^{im} - (G \sin θ + B \cos θ)U_1^{re}$ Before starting the iterative process, the iteration counter i is set to 1 and the initial value of the variable x is set to $x^{(0)} = [G\ B\ C\ θ]^T$, where G, B, C and θ are the initial values as previously determined.

Then the least squares algorithm is performed as follows:

do

Calculate Jacobian matrix $H_{k,j} = \dfrac{\partial f_k(x^{(i-1)})}{\partial x_j}$;

-continued $k = 1, 2, \ldots, m$; $j = 1, 2, 3, 4$

//where m is number of measurements and $m \geq 4$

Compute $b_k = f_k(x^{(i-1)})$

Solve the linear problem $\Delta x = (H^T H)^{-1}(H^T b)$;

$x^{(i)} = x^{(i-1)} + \Delta x$ $i = i + 1$ while $i < maxIter$

For a given value of k, the Jacobian matrix H is $$H = \begin{bmatrix} \dfrac{\partial I_1^{re}}{\partial G} & \dfrac{\partial I_1^{re}}{\partial B} & \dfrac{\partial I_1^{re}}{\partial C} & \dfrac{\partial I_1^{re}}{\partial θ} \\ \dfrac{\partial I_1^{im}}{\partial G} & \dfrac{\partial I_1^{im}}{\partial B} & \dfrac{\partial I_1^{im}}{\partial C} & \dfrac{\partial I_1^{im}}{\partial θ} \\ \dfrac{\partial I_2^{re}}{\partial G} & \dfrac{\partial I_2^{re}}{\partial B} & \dfrac{\partial I_2^{re}}{\partial C} & \dfrac{\partial I_2^{re}}{\partial θ} \\ \dfrac{\partial I_2^{im}}{\partial G} & \dfrac{\partial I_2^{im}}{\partial B} & \dfrac{\partial I_2^{im}}{\partial C} & \dfrac{\partial I_2^{im}}{\partial θ} \end{bmatrix}$$

and the residual vector b is $$b = \begin{bmatrix} I_{1M}^{re} - I_1^{re} \\ I_{1M}^{im} - I_1^{im} \\ I_{2M}^{re} - I_2^{re} \\ I_{2M}^{im} - I_2^{im} \end{bmatrix}.$$

In the residual vector b, the current values with index 1M and 2M are the measured values.

When the iteration index i reaches the maximum value maxIter, the algorithm ends and the last value of the vector x contains the resulting values of G, B, C and θ.

By applying the method described above, it is possible to provide highly accurate estimates of power transmission line parameters using asynchronous measurements, i.e. without expensive PMUs with time references fixed to GPS time.

It is noted that the term "comprising" does not exclude other elements or steps and the use of the articles "a" or "an" does not exclude a plurality. Also elements described in association with different embodiments may be combined. It is further noted that reference signs in the claims are not to be construed as limiting the scope of the claims.

The invention claimed is:

1. A method of determining power transmission line parameters using non-synchronous measurements acquired from different locations along a power transmission line, the method comprising
acquiring first measurement data comprising corresponding pairs of voltage and current measurement values measured at a first location along the power transmission line at predetermined points in time relative to a first time reference,
acquiring second measurement data comprising corresponding pairs of voltage and current measurement values measured at a second location along the power transmission line at predetermined points in time relative to a second time reference,
calculating initial values of the power transmission line parameters and an initial value of the difference between the first time reference and the second time reference based on the first measurement data and the second measurement data, and calculating resulting values of the power transmission line parameters and a resulting value of the difference between the first time reference and the second time reference by utilizing a least squares algorithm and the initial values of the power transmission line parameters, the initial value of the difference between the first time reference and the second time reference, the first measurement data, and the second measurement data, wherein the power transmission line parameters comprise series conductance, series susceptance, and shunt capacitance.

2. The method according to claim 1, wherein the initial value of the series conductance (G) and the initial value of the series susceptance (B) are calculated by calculating a first admittance based on the first measurement data, calculating a second admittance based on the second measurement data, calculating a series impedance ($Z_S$) based on the first admittance and the second admittance, calculating the initial value of the series conductance as the real part of the reciprocal of the series impedance, and calculating the initial value of the series susceptance as the imaginary part of the reciprocal of the series impedance.

3. The method according to claim 2, wherein the initial value of the shunt capacitance is calculated by applying sensitivity analysis with regard to active power loss and reactive power loss.

4. The method according to claim 2, wherein the initial value of the difference between the first time reference and the second time reference is calculated as a difference between the phase of the voltage of the second measurement data and the phase of a voltage calculated on the basis of the first measurement data and the initial value of the series conductance, the initial value of the series susceptance, and the initial value of the shunt capacitance.

5. The method according to claim 1, wherein the initial value of the shunt capacitance is calculated by applying sensitivity analysis with regard to active power loss and reactive power loss.

6. The method according to claim 1, wherein the initial value of the difference between the first time reference and the second time reference is calculated as a difference between the phase of the voltage of the second measurement data and the phase of a voltage calculated on the basis of the first measurement data and the initial value of the series conductance, the initial value of the series susceptance, and the initial value of the shunt capacitance.

7. The method according to claim 1, wherein the first measurement data is acquired by a first data acquisition device positioned at the first location, the second measurement data is acquired by a second data acquisition device positioned at the second location, and the steps of calculating initial values and resulting values is carried out by the first data acquisition device after receiving the second measurement data from the second data acquisition device.

8. The method according to claim 7, further comprising sending a start signal from the first data acquisition device to the second data acquisition device, sending a response signal from the second data acquisition device to the first data acquisition device, determining a communication roundtrip time, and continuing with the calculation of initial values and resulting values if the communication roundtrip time is below a predetermined threshold value.

9. A computer program comprising non-transitory computer executable instructions, which, when executed by a processor of a computer, are configured to carry out the method according to claim 1.

10. A data carrier loaded with the computer program according to claim 9.

11. A data acquisition device for determining power transmission line parameters, the data acquisition device comprising a clock unit adapted to provide a time reference, a data acquisition unit adapted to acquire measurement data comprising corresponding pairs of voltage and current measurement values at a location along a power transmission line at predetermined points in time relative to the time reference, a data communication unit adapted to receive remote measurement data from a remote data acquisition device, the remote measurement data comprising corresponding pairs of voltage and current measurement values measured at a remote location along the power transmission line at predetermined points in time relative to a remote time reference, and a data processing unit adapted to calculate initial values of the power transmission line parameters and an initial value of a difference between the time reference and the remote time reference based on the measurement data and the remote measurement data, and calculate resulting values of the power transmission line parameters and a resulting value of the difference between the time reference and the remote time reference by utilizing a least squares algorithm and the initial values of the power transmission line parameters, the initial value of the difference between the time reference and the remote time reference, the measurement data, and the remote measurement data, and wherein the power transmission line parameters comprise series conductance, series susceptance, and shunt capacitance.

12. A system for determining power transmission line parameters using non-synchronous measurements acquired from different locations along a power transmission line, the system comprising a first data acquisition device adapted to acquire first measurement data comprising corresponding pairs of voltage and current measurement values measured at a first location along the power transmission line at predetermined points in time relative to a first time reference, a second data acquisition device adapted to acquire second measurement data comprising corresponding pairs of voltage and current measurement values measured at a second location along the power transmission line at predetermined points in time relative to a second time reference, and a data processing device adapted to calculate initial values of the power transmission line parameters and an initial value of the difference between the first time reference and the second time reference based on the first measurement data and the second measurement data, and calculate resulting values of the power transmission line parameters and a resulting value of the difference between the first time reference and the second time reference by utilizing a least squares algorithm and the initial values of the power transmission line parameters, the initial value of the difference between the first time reference and the second time reference, the first measurement data, and the second measurement data, and wherein the power transmission line parameters comprise series conductance, series susceptance, and shunt capacitance.

13. The system according to claim 12, wherein the first data acquisition device is a phasor measurement unit, the first time reference is GPS time, and the first data acquisition device is adapted to use the resulting value of the difference between the first time reference and the second time reference to synchronize the second data acquisition device to the first time reference.

\* \* \* \* \*